United States Patent [19]

Winston et al.

[11] Patent Number: 5,234,505
[45] Date of Patent: Aug. 10, 1993

[54] STABILIZATION OF SILICATE SOLUTIONS

[75] Inventors: Anthony E. Winston, East Brunswick; Steven E. Dunn, Hillsborough; Francis R. Cala, Highland Park; Alfredo Vinci, Dayton; M. Stephen Lajoie, Basking Ridge, all of

[73] Assignee: Church & Dwight Co., Inc., Princeton, N.J.

[21] Appl. No.: 896,381

[22] Filed: Jun. 10, 1992

Related U.S. Application Data

[63] Continuation-in-part of Ser. No. 731,512, Jul. 17, 1991, abandoned.

[51] Int. Cl.$^5$ .................................................. C23G 5/06
[52] U.S. Cl. .......................................... 134/40; 134/2; 134/42; 252/135
[58] Field of Search ................................ 134/2, 40, 42

[56]  References Cited

U.S. PATENT DOCUMENTS

| | | | |
|---|---|---|---|
| 2,739,129 | 3/1956 | Manchot | 252/89 |
| 2,741,599 | 4/1956 | McDonald et al. | 252/138 |
| 3,023,132 | 2/1962 | Diamond et al. | 134/10 |
| 3,672,993 | 6/1972 | Mitchell et al. | 134/3 |
| 3,847,663 | 11/1974 | Shumaker | 134/2 |
| 3,904,685 | 9/1975 | Shahidi et al. | 260/537 |
| 4,089,703 | 5/1978 | White | 134/22 |
| 4,214,915 | 7/1980 | Dillarstone et al. | 134/19 |
| 4,228,048 | 10/1980 | Tesdahl | 260/17.4 |
| 4,283,299 | 8/1981 | Becker et al. | 252/90 |
| 4,304,680 | 12/1981 | Wixon | 252/114 |
| 4,347,152 | 8/1982 | Wixon | 252/174 |
| 4,348,292 | 9/1982 | Ginn | 252/90 |
| 4,362,640 | 12/1982 | Schreiber | 252/135 |
| 4,382,825 | 5/1983 | McCready | 134/2 |
| 4,434,069 | 2/1984 | Fairchild | 252/174 |
| 4,457,322 | 7/1984 | Rubin et al. | 134/2 |
| 4,521,332 | 6/1985 | Milora | 252/527 |
| 4,528,039 | 7/1985 | Rubin et al. | 134/2 |
| 4,539,133 | 9/1985 | Boskamp | 252/109 |
| 4,554,026 | 11/1985 | Cosper et al. | 134/38 |
| 4,741,863 | 5/1988 | Yamamoto et al. | 252/547 |
| 4,756,846 | 7/1988 | Matsuura et al. | 252/156 |
| 4,783,281 | 11/1988 | Bishop et al. | 252/135 |
| 4,820,440 | 4/1989 | Hemm et al. | 252/135 |
| 4,820,441 | 4/1989 | Evans et al. | 252/174.18 |
| 4,844,744 | 7/1989 | Leiter et al. | 134/40 |
| 4,869,844 | 9/1989 | Johnson | 252/159 |
| 5,015,408 | 5/1991 | Reuss | 252/99 |
| 5,049,200 | 9/1991 | Brunner et al. | 134/2 |
| 5,096,609 | 5/1992 | Dany et al. | 252/135 |
| 5,108,641 | 4/1992 | Ahmed et al. | 252/94 |

Primary Examiner—Patrick P. Garvin
Attorney, Agent, or Firm—Charles B. Barris

[57] ABSTRACT

The present invention is directed to aqueous cleaning compositions such as for household use or for cleaning electronic circuit assemblies comprising alkaline salt, an alkali metal silicate to boost detersive action or to provide corrosion protection to the substrates which are cleaned and an anionic polymer which stabilizes the alkali metal silicate to prevent precipitation of the silicate from solution.

18 Claims, 7 Drawing Sheets

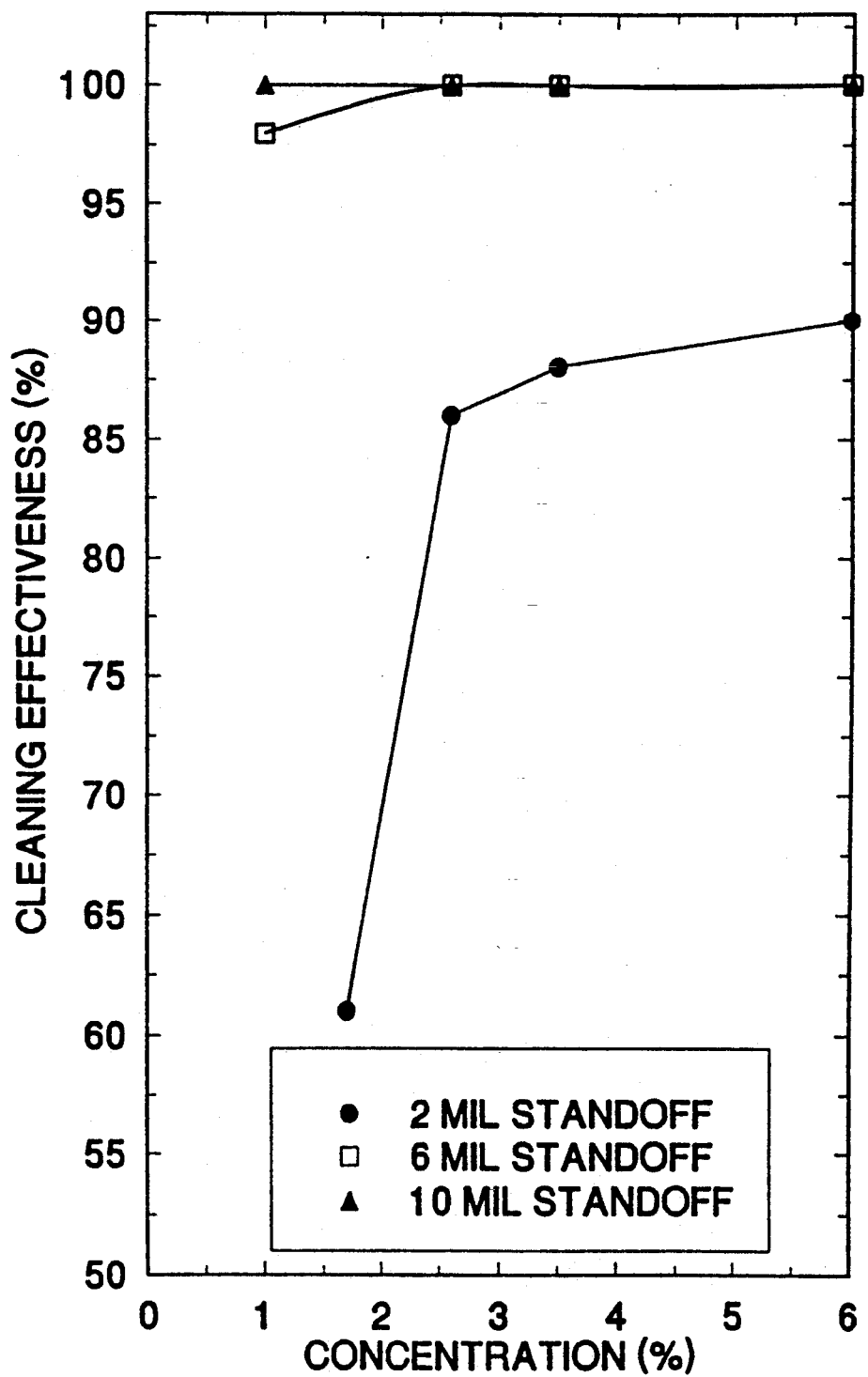

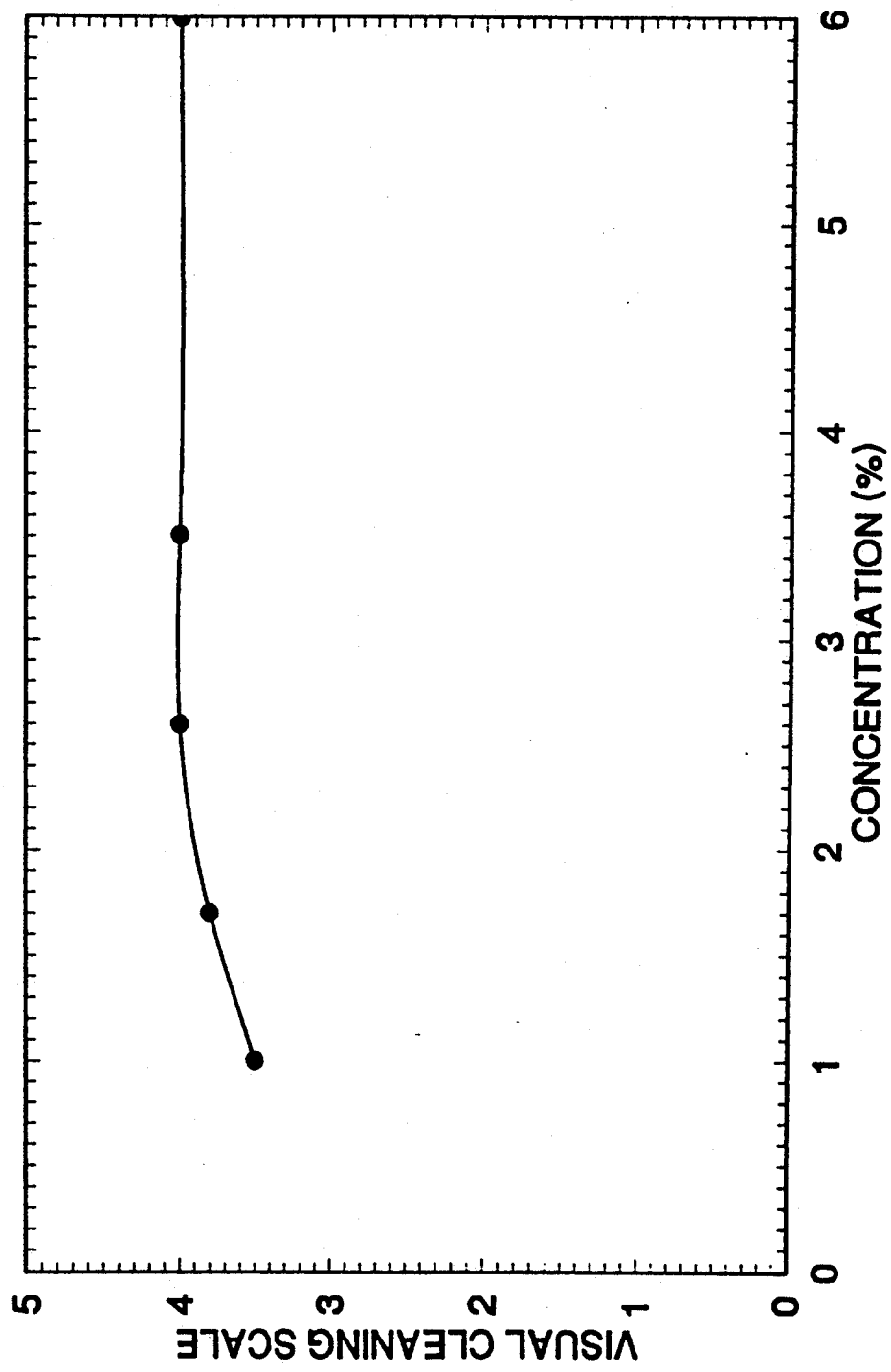

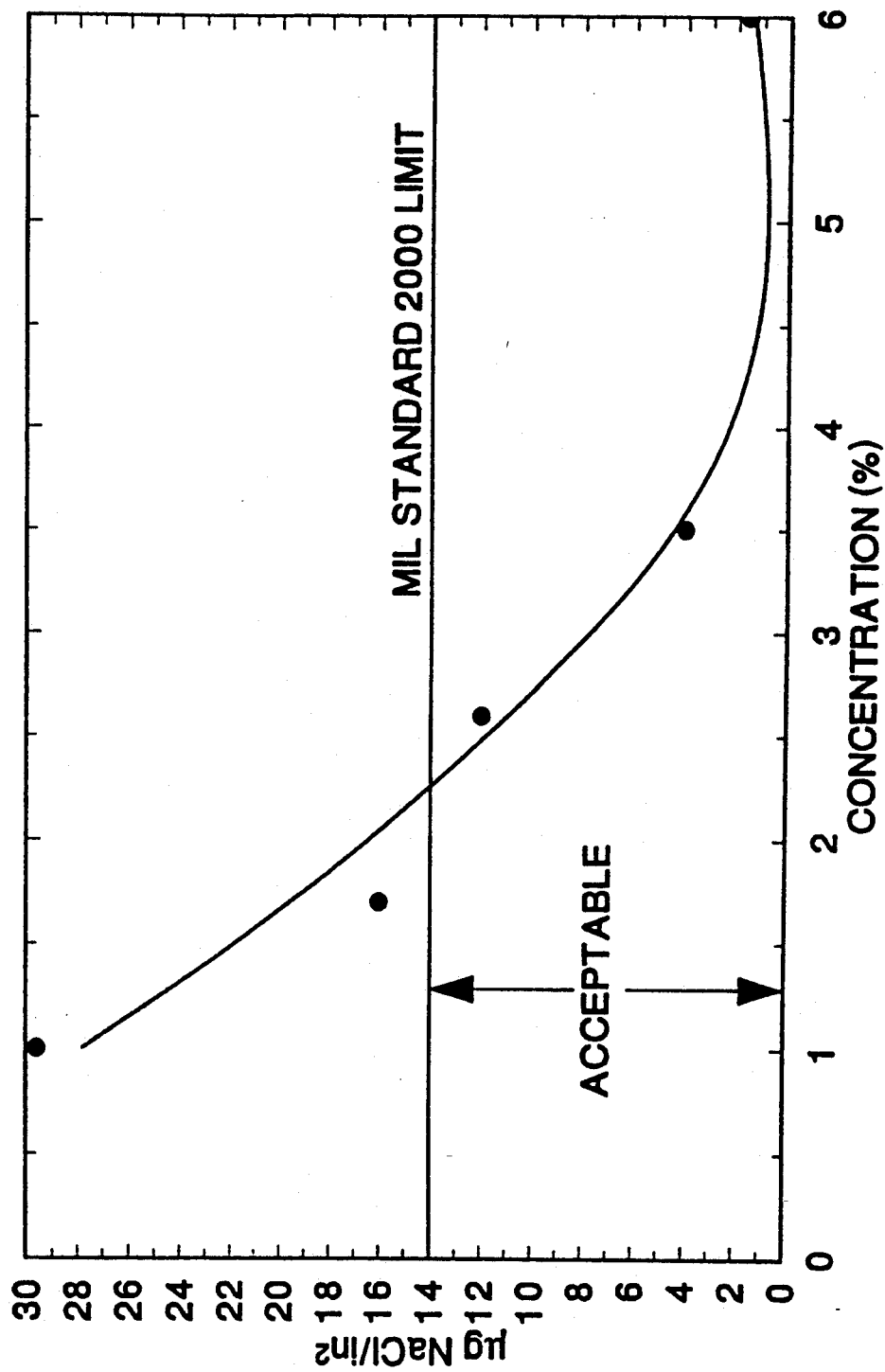
FIG. 3: H40 BOARD
Ω METER RESULTS

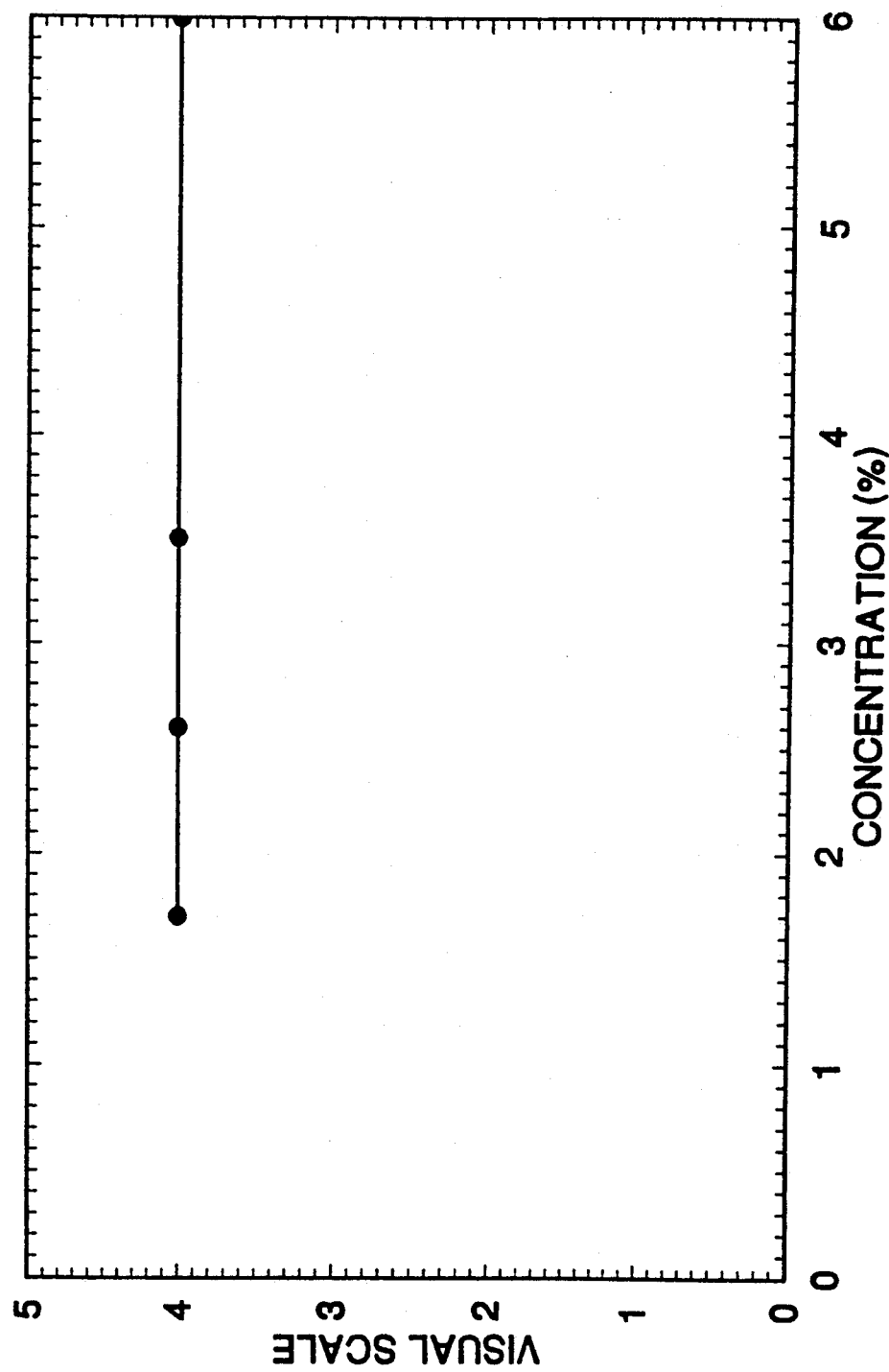

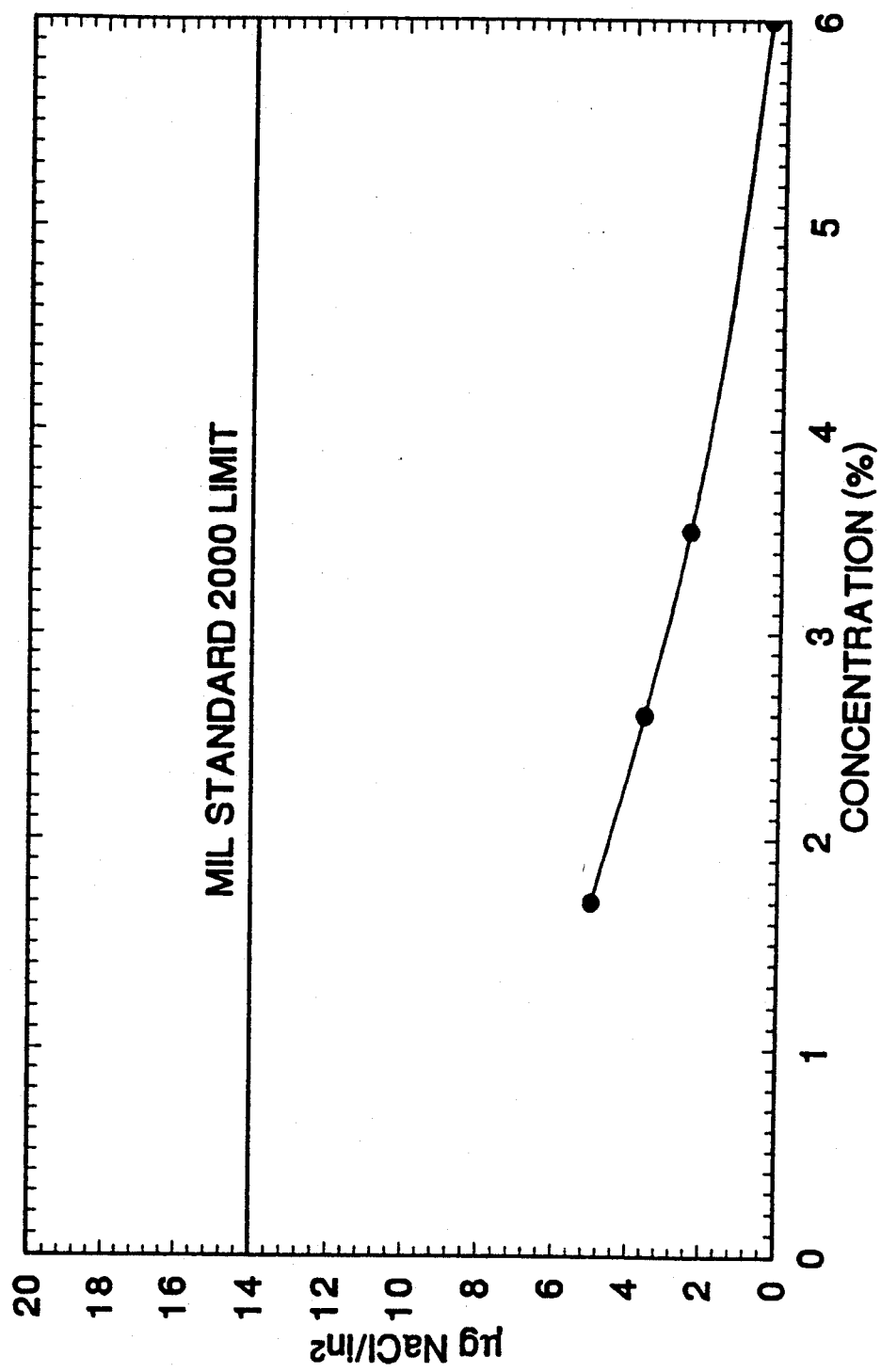

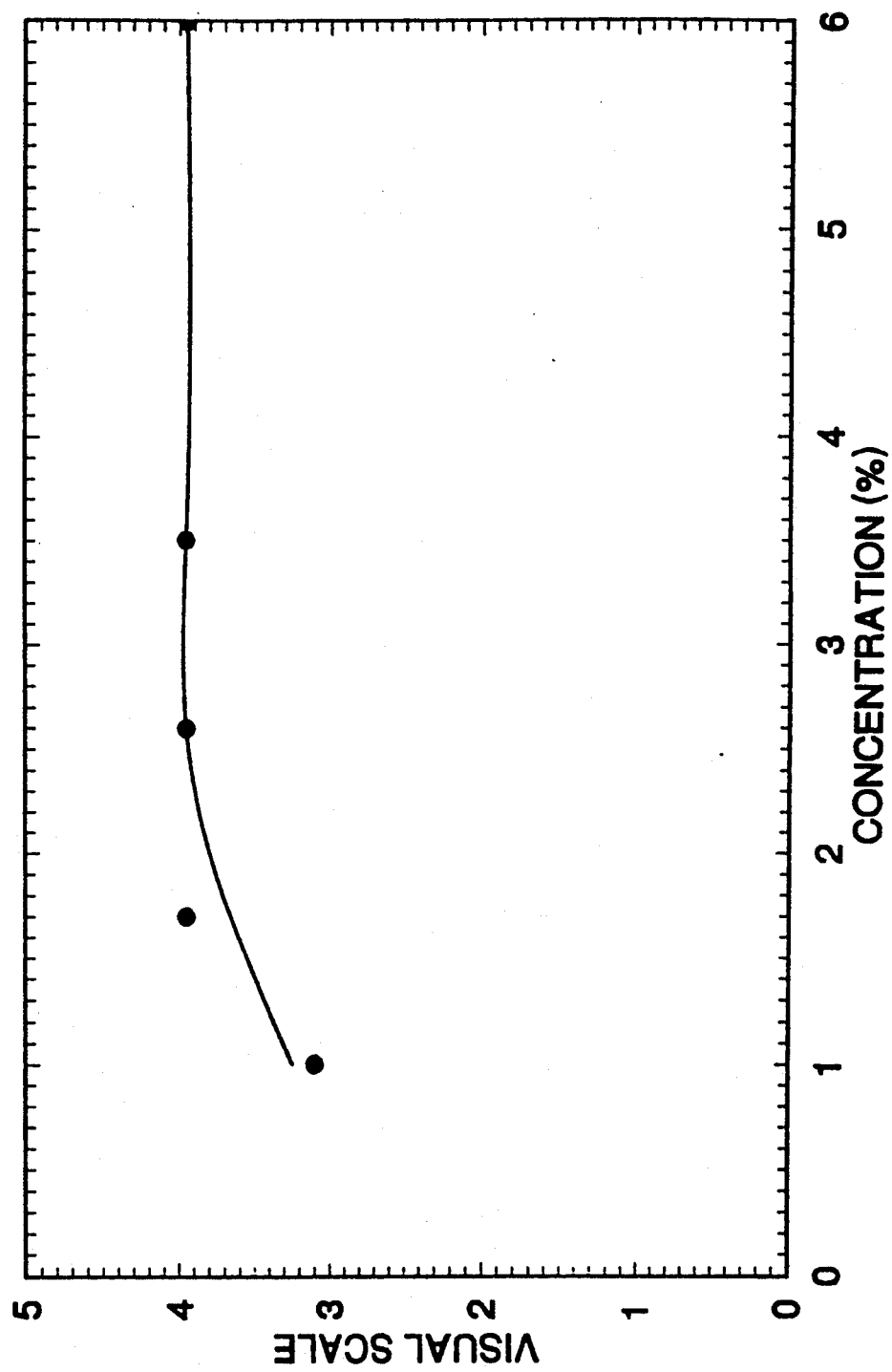

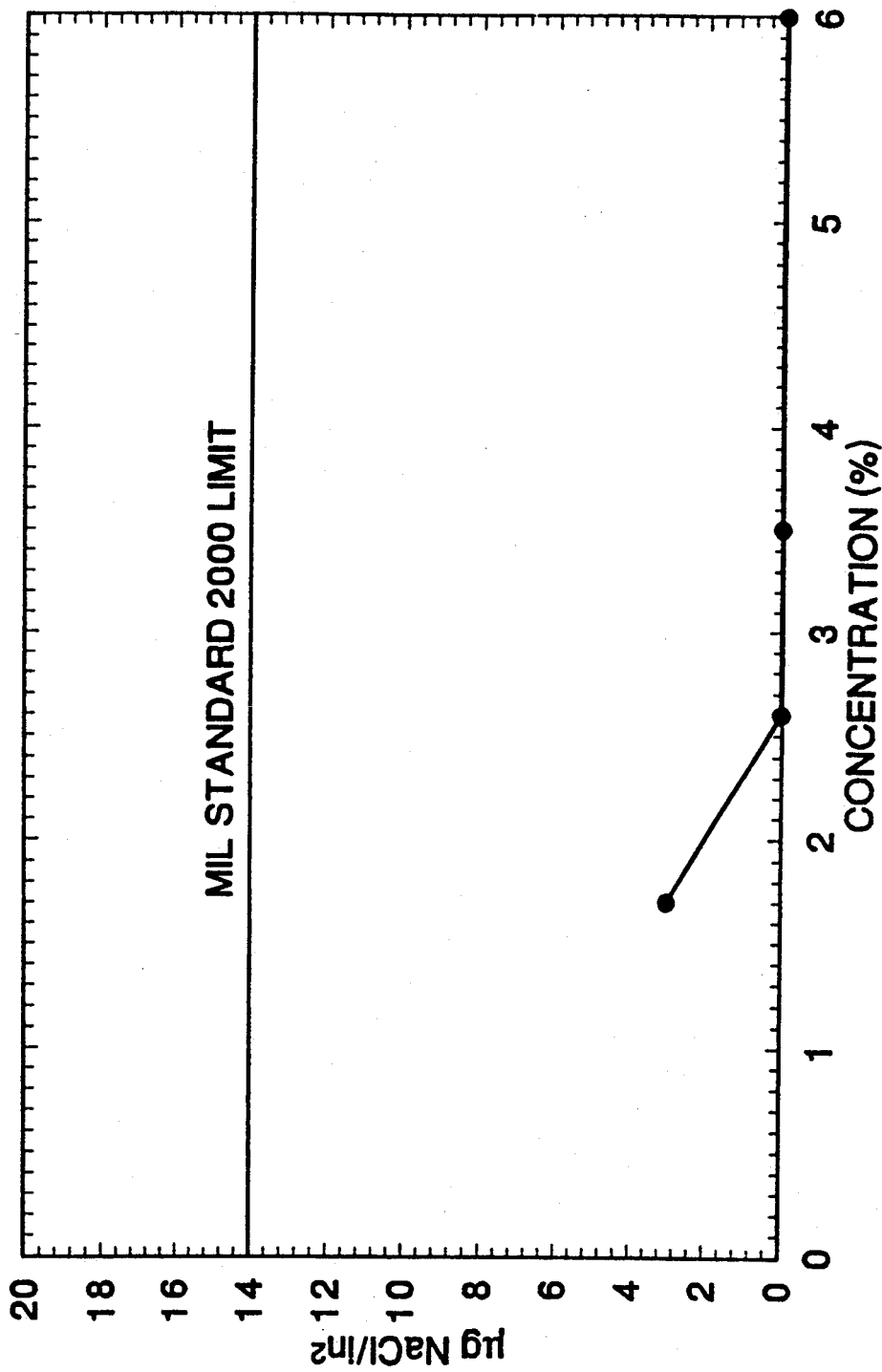
FIG. 7: REFLOWED DEMO BOARD
IONIC CONTAMINATION RESULTS

STABILIZATION OF SILICATE SOLUTIONS

This application is a Continuation-in-part of U.S. Ser. No. 07/731,512, filed Jul. 17, 1991, now abandoned.

FIELD OF THE INVENTION

The present invention is directed to improvements in aqueous cleaning compositions. In particular, the invention is concerned with aqueous cleaning compositions which contain alkaline salts and a silicate salt either to enhance cleaning or to provide corrosion protection and to improvements in maintaining the silicate in aqueous solution.

BACKGROUND OF THE INVENTION

Silicates such as alkali metal silicates are extremely effective in protecting metals and ceramics against the corrosive effects of alkaline solutions. Moreover, such silicates also provide useful detergent boosting effects when present in cleaning solutions. Accordingly, alkali metal silicates are widely used in a broad range of detergent products such as automatic dishwashing detergents, metal cleaners and laundry detergents.

Another important usage of alkali metal silicates is as an additive in aqueous cleaning solutions used to remove solder flux and other residues from electronic circuit assemblies such as printed circuit boards or printed wiring boards. As described in commonly-assigned co-pending application, U.S. Ser. No. 731,512, filed Jul. 17, 1991, it has been found that solder fluxes contained on electronic circuit assemblies, such as printed circuit boards and printed wiring boards, can be effectively removed by contact with aqueous solutions of alkaline salts such as alkali metal carbonates and mixtures of alkali metal carbonates and bicarbonates. It has further been found that the addition of alkali metal silicates to such formulations greatly improves the corrosion protection of ceramic and metal components on such electronic assemblies.

Accordingly, while the improved aqueous cleaning compositions of this invention are useful in many and varied types of cleaning compositions, such as dishwashing detergents, laundry detergents and the like, the compositions of this invention are particularly useful in removing solder flux and other residues from electronic circuit assemblies such as disclosed in the above-mentioned commonly assigned application.

The cleanliness of electronic circuit assemblies (ECA), such as printed circuit boards (PCB) or printed wiring boards (PWB), is generally regarded as being critical to their functional reliability. Ionic and nonionic contamination on circuit assemblies is believed to contribute to premature failures of the circuit assemblies by allowing short circuits to develop.

In the manufacture of electronic circuit assemblies, ionic and nonionic contamination can accumulate after one or more steps of the process. Circuit assembly materials are plated, etched, handled by operators in assembly, coated with corrosive or potentially corrosive fluxes and finally soldered.

In the fabrication of electronic circuit assemblies, e.g., printed circuit boards, soldering fluxes are first applied to the substrate board material to ensure firm, uniform bonding of the solder. These soldering fluxes fall into two broad categories: rosin and non-rosin, or water soluble, fluxes. The rosin fluxes, which are generally only moderately corrosive and have a much longer history of use, are still widely used throughout the electronics industry. The water soluble fluxes, which are a more recent development, are being used increasingly in consumer products applications. Because water soluble fluxes contain strong acids and/or amine hydrohalides, such fluxes are very corrosive. Unfortunately, residues of any flux can cause circuit failure if residual traces of the material are not carefully removed following soldering and thus remain on an electronic circuit assembly.

While water soluble fluxes can be easily removed with warm, soapy water, the removal of rosin flux from printed circuit boards is more difficult and has therefore traditionally been carried out with the use of chlorinated hydrocarbon solvents such as 1,1,1,-trichlorethane, trichloroethylene, trichloromonofluoromethane, methylene chloride, trichlorotrifluoroethane (CFC113), tetrachlorodifluoroethane (CFC112) or mixtures or azeotropes of these and/or other solvents. These solvents are undesirable, however, because they are toxic and when released into the environment deplete the ozone layer and/or contribute to the greenhouse global warming effect. Thus, use of such solvents is subject to close scrutiny by the Occupational Safety and Health Administration (OSHA) and the Environmental Protection Agency (EPA), and stringent containment equipment must be used. Moreover, if released into the environment these solvents are not readily biodegradable and are thus hazardous for long periods of time.

Alkaline cleaning compounds known as the alkanolamines, usually in the form of monoethanolamine, have been used for rosin flux removal as an alternative to the toxic chlorinated hydrocarbon solvents. These high pH compounds (e.g., about 12 pH), chemically react with rosin flux to form a rosin soap through the process of saponification. Other organic substances such as surfactants or alcohol derivatives may be added to these alkaline cleaning compounds to facilitate the removal of such rosin soap. Unfortunately, these compounds, as well as the water soluble soldering fluxes, have a tendency to cause corrosion on the surfaces and interfaces of printed wiring boards if such compounds and fluxes are not completely and rapidly removed during the fabrication process.

In other approaches, Daley et al., U.S. Pat. No. 4,635,666 utilize a highly caustic solution having a pH of 13 in a batch cleaning process. This method severely oxidizes the solder applied to the circuit board. In Hayes et al., U.S. Pat. Nos. 4,640,719 and 4,740,247 rosin soldering flux and other residues are removed from electronic assemblies by means of terpene compounds in combination with terpene emulsifying surfactants by rinsing in water.

The complete removal of adhesive and other residues also poses a problem. During the manufacture of electronic circuit assemblies the components are mounted on the upper surface of the board with leads protruding downwardly through holes in the board and are secured to the bottom surface of the board by means of an adhesive. Further, it is sometimes necessary to temporarily protect certain portions of the board from processing steps such as the process of creating corrosion resistant gold connecting tabs at the board edges. This transient protection of portions of the circuit board can be achieved by the application of special adhesive tape to susceptible areas. Once such protection is no longer needed, the adhesive tape must be removed. In both instances, a residue of adhesive generally remains which, if not thoroughly removed, can cause premature board failure. Removal of this adhesive residue has traditionally been carried out by the use of chlorinated solvents which, as already described, are toxic and environmentally undesirable.

Thus, the residual contaminants which are likely to be found on electronic circuit assemblies and which can be removed by the compositions and method of the present invention include, but are not limited to, for example, rosin flux, photoresist, solder masks, adhesives, machine oils, greases, silicones, lanolin, mold release, polyglycols and plasticizers.

The cleaning compositions for electronic circuit assemblies as described in the above-mentioned commonly assigned application have a relatively low pH compared to prior art aqueous circuit board cleaners which utilize high pH, i.e., 12 and above, aqueous cleaning compositions. These high pH solutions are very corrosive on the circuit assemblies and are relatively unsafe to use. The prior art cleaners also yield high biological oxygen demands and chemical oxygen demands in the water effluents from the cleaning process. Unfortunately, as the pH is lowered, any alkali metal silicate which is present in the cleaning composition either to improve detersive action or, more particularly, as an anti-corrosion agent tends to flock out of the solution. It would be very advantageous to include alkali metal silicate in the alkaline aqueous cleaning compositions for electronic circuit assemblies in order to protect the ceramic and metal components of the circuit assemblies from the corrosive action of the alkaline metal cleaning salts. At the same time it would be advantageous to maintain a relatively low pH in the cleaning solutions so as to minimize the corrosive effects thereof and to ensure safety to humans resulting from accidental exposure to the product or solutions thereof. Many household cleaners have relatively low pH's and would be enhanced by the addition of stabilized silicate corrosion inhibitors.

SUMMARY OF THE INVENTION

It is the primary objective of the invention to provide cleaning compositions for use in aqueous solutions which contain alkaline salts and an alkaline silicate added as a detergent boosting agent or as an anti-corrosion agent and which are stabilized such that the silicate does not flock from the cleaning solution.

It is another object of the present invention to provide cleaning compositions which contain alkaline cleaning salts and alkaline silicates such that in aqueous solution the compositions have a pH of 13 or below, preferably below pH 12, and are stabilized so as to prevent the silicate from flocking out of the solution.

The cleaning solutions of this present invention are applicable to a wide variety of uses such as dishwashing detergents, laundry detergents, metal cleaners, etc. The invention is particularly useful in electronic circuit assembly cleaners such as described in U.S. Ser. No. 713,512 since such aqueous cleaning solutions for the removal of solder flux and other residues from electronic circuit assemblies can have a substantially reduced pH than prior art electronic circuit assembly aqueous cleaners and still be as effective as the highly alkaline cleaners. However, it is at the lower pH range of such aqueous cleaning solutions where the problem of silicate precipitation from the solution is more pronounced.

This invention provides cleaning compositions and methods for the removal of rosin solder fluxes and other residues during the fabrication of printed circuit or wiring boards. As a result, the possibility of premature circuit failure that might occur in the absence of such cleaning is eliminated or greatly reduced. The cleaning efficacy of the compositions of the invention is such that printed wiring boards thus treated meet stringent U.S. Department of Defense specifications.

The compositions of the invention are characterized by non-corrosiveness and low environmental impact, unlike the chlorinated hydrocarbon solvents and highly alkaline cleaners that have heretofore been employed for printed wiring board and printed circuit board cleaning. Advantageously, the flux removing compositions, as used herein, exhibit lower biological oxygen demands (BOD) and chemical oxygen demands (COD) than formulations currently available. For example, BODs and CODs below 20,000 ppm in the wash water and considerably lower, e.g. less than 300 ppm in the rinse water result upon using the cleaning compositions of this invention. Accordingly, the rinse water can be sewered without further treatment and minimal, if any, treatment is needed to remove the organics from the wash water before sewering, thus eliminating the need for costly water treatment.

The present invention provides aqueous printed circuit/wiring board cleaning compositions comprising alkaline salts so combined that they have, when used in concentrations of about 0.1 to 15 percent by weight, a pH of at least about 10 to 13, preferably to 12 or less. The compositions, when used in the above-mentioned concentrations, should have an adequate reserve of titratable alkalinity, for example, at least equivalent to from about 0.2 to 4.5 percent caustic potash (potassium hydroxide), when titrated to the colorless phenolphthalein end point, which is about pH 8.4. The cleaning compositions of this invention further include an alkaline silicate which acts as a corrosion inhibitor. It has now been found that aqueous cleaning solutions which contain silicates can be stabilized and the flocculation of the silicates prevented by the addition of one or more anionic polymers. In particular, anionic polymers containing carboxylate groups have been found to prevent the flocculation of the silicates, especially from aqueous solutions having a pH of less than 12.

When used according to the above, the compositions do not leave an undesirable residual film and are effective in removing the fluxes and other residue from electronic circuit boards.

BRIEF DESCRIPTION OF THE DRAWINGS

The efficacy of this invention will be better understood by reference to FIGS. 1–7 herein wherein the test results of certain embodiments of the cleaners of this invention are illustrated.

FIGS. 1, 2, 4, and 6 represent typical curves showing the cleaning efficiencies of various concentrations of cleaning solutions resulting from visual testing as described herein.

FIGS. 3, 5 and 7 represent typical curves showing the cleaning efficiencies of various concentrations of cleaning solutions resulting from equilibrium resistivity measurements as described herein.

DETAILED DESCRIPTION OF THE INVENTION

The objects and advantages mentioned above as well as other objects and advantages may be achieved by the compositions and methods hereinafter described.

Essentially, the flux removing compositions of the invention comprise mixtures of alkali metal salts. Accordingly, the term "flux removing compositions" as used herein is intended to define the mixture of essentially active ingredients comprised of the alkali metal salts, and additional performance enhancers such as silicate corrosion inhibitors and any other adjuvants such as surfactants, antifoam agents, etc. as hereinafter described.

As hereinlater set forth, the flux removing compositions may be formulated into concentrated solutions. The terms "flux removing concentrated solutions" or "concentrates" as used herein define aqueous mixtures containing from about 5 to 45 or more percent by weight of the flux removing compositions with the balance being essentially water.

As used herein the terms "flux removing solutions" or "flux removing solutions in use" is meant to define aqueous mixtures containing from about 0.1 to 15 percent by weight of the flux removing composition with the balance comprised essentially of water and which are the solutions employed in the cleaning methods of the invention. Also, as used herein, "flux removing composition" and "cleaning composition" have the same meaning since as stated previously, the electronic circuit assemblies including printed circuit boards and printed wiring boards often contain residues other than fluxes which the compositions of this invention are able to remove and thus "flux removing composition" is intended as an all-purpose cleaner.

In accordance with the invention, additives, adjuvants, or the like, may be included with the flux removing compositions, flux removing concentrates, or the flux removing solutions in use.

The flux removing compositions of the present invention contain mixtures of alkaline salts. Suitable alkaline salts or mixtures thereof for the invention are those capable of providing the desired pH. Most suitable are the salts of potassium, sodium and ammonium with potassium being preferred. Especially preferred are the carbonates and bicarbonates which are economical, safe and environmentally friendly. The carbonate salts include potassium carbonate, potassium carbonate dihydrate, and potassium carbonate trihydrate, sodium carbonate, sodium carbonate decahydrate, sodium carbonate heptahydrate, sodium carbonate monohydrate, sodium sesquicarbonate and the double salts and mixtures thereof. The bicarbonate salts include potassium bicarbonate and sodium bicarbonate and mixtures thereof.

Also suitable alkaline salts include the alkali metal ortho or complex phosphates. The complex phosphates are especially effective because of their ability to chelate water hardness and heavy metal ions. The complex phosphates include, for example, sodium or potassium pyrophosphate, tripolyphosphate and hexametaphosphates. Additional suitable alkaline salts useful in the cleaning compositions of this invention include the alkali metal borates, acetates, citrates, tartrates, gluconates, succinates, silicates, phosphonates, nitrilotriacetates, edates, etc.

Generally, the flux removing compositions of the invention will contain the alkaline salts in amounts of from about 60-98%. The alkaline salts are utilized in combination and in concentrations such that the resultant solutions have a pH of from about 10, or somewhat less, to 13, preferably from about 10 to less than 12 and, more preferably from 10.5 to 10.9. The desired pH of the cleaning solution may depend on the type of flux being removed. Thus, the lower pH range is desirable and effective for removing the more easily removed fluxes. However, a pH of above 11.5 is preferred when removing the more difficult to remove solder paste fluxes. As stated above, it is most desirable that the alkaline salts utilized in combination at the dilution of the wash bath and at the desired pH also have an adequate reserve of titratable alkalinity, at least equivalent to from about 0.2 to 4.5 percent caustic potash (potassium hydroxide), when titrated to the colorless phenolphthalein end point, which is at about pH 8.4 to maintain enhanced performance.

For other types of cleaners such as for household use including laundry detergents, dishwasher detergents and the like, lower pH's are useful. Thus, in general, the compositions of this invention may yield pH's as low as 9.5 in aqueous solution and remain effective. For such household use, ammonium salts may be used effectively.

The flux removing compositions of the invention contain one or more corrosion inhibitors to prevent corrosion or pitting of the connecting tabs or solder joints, metals or other materials present on the circuit boards being cleaned. The corrosion inhibitor is an alkali metal silicate salt with the sodium and potassium silicate salts being most preferred. The alkali metal silicates which are used can be in a variety of forms which can be encompassed generally by the formula $[Alk]_2O:SiO_2$ wherein $[Alk]$ represents the alkali metal and in which the ratio of the two oxides can vary. Most useful alkali metal silicates will have an $[Alk]_2O$ to $SiO_2$ mole ratio of between 1:0.5 to 1:4.5. Most preferably, the $[Alk]_2O$ to $SiO_2$ ratio is between 1:1.6 and 1:4.0. Such silicates also provide additional alkalinity to the wash water to help cleaning. Surprisingly, it has been found that the addition of silicate actually promotes the brightness and shininess of the solder joints. Other corrosion inhibitors could be used if silicate salts are present as detersive boosting agents. For sufficient corrosion protection, it is useful to add 0.1 to 10 wt. % of the silicate corrosion inhibitor based on the amount of cleaning composition (without water).

At low pH, i.e., below 13 and, in particular, below 12, it has been found that the silicate precipitates from aqueous solutions such as the diluted wash bath. Silicate precipitation from aqueous concentrates of the cleaning compositions readily occurs. In accordance with this invention, the silicates are stabilized and kept in aqueous solution by the addition of an anionic polymer to the composition. Particularly preferred are anionic polymers containing carboxylate groups.

In general, anionic homopolymers or copolymers with molecular weights between about 1,000 to about 5,000,000 or mixtures thereof are usefully employed in this invention as silicate stabilizers. However, the optimal polymers are ones which dissolve easily and do not increase the viscosity of the solutions to excessive levels when added at the concentration required for optimum silicate stability.

When a single anionic polymer is used as the stabilizing agent, it preferably should have a molecular weight of above about 20,000. However, mixtures of high molecular weight anionic polymers for example above 100,000 with low molecular weight anionic polymers have been found to work surprisingly well.

The following anionic polymers are noninclusive examples of those suitable for stabilizing silicate solutions according to this invention: carboxymethylcellulose, polyacrylic acid, polymethacrylic acid, polymaleic acid, polyglycolic acid, heteropolymers of acrylic and methacrylic acid, xanthan gum, carregeenan gum and alginate gum. In the alkaline solutions of this invention, the anionic polymers are essentially present in the form of the sodium or potassium salts thereof.

In one preferred embodiment of the invention, carboxymethylcellulose (CMC) is used as the sole stabilizing agent. The CMC used should have a degree of substitution of from about 0.4 to about 1.5. Most desirably, the degree of substitution should be from about 0.7 to 1.2. The molecular weight of the CMC used should optimally be in the range of about 50,000 to about 1,000,000, most preferably from about 90,000 to about 200,000. The quantity of CMC needed will depend on the level of silicate in the composition, the concentration of alkaline salts and the solution pH. At pH's of about 10.5 to 11.0 and with silicate concentrations above about 1.0 wt. %, at least about 0.5 wt. % CMC is needed, most preferably from about 0.8 to 1.8% is used. Higher concentrations of CMC may raise the viscosity to unmanageably high levels.

In another preferred embodiment, polyacrylic acid such as in the form of sodium polyacrylate in solution is employed as the sole silicate stabilizing agent. The polyacrylate used in this embodiment should preferably have a molecular weight of between about 50,000 and 4,000,000. An especially preferred molecular weight range is about 100,000 to 800,000.

In still another preferred embodiment, carboxymethylcellulose is used in combination with a low molecular weight polyacrylate polymer. In this embodiment, the combination of CMC as described above is used in conjunction with a polyacrylate of molecular weight between about 1,000 and 10,000.

When CMC is used in combination with low molecular weight polyacrylate polymers, it has been found preferable to add the polyacrylate in acid form to the CMC solution. The silicate is then added before neutralization of the polymer with caustic soda or alkali salts. Surprisingly, mixing the silicate with the polymer in acid form enhances the stability of the silicate in solution.

It is also useful to include at least one antifoam agent in any of the flux removing compositions of this invention. The antifoam agent is utilized to prevent the formation of excessive foam caused by the rosin flux/flux removing combination. The presence of foam interferes with the mechanical action of the cleaning equipment used to wash the circuit boards. It is important, if not critical, that the antifoam agent used herein does not act by replacing the flux film with another residual surface film which could affect the performance of the electronic circuit board in use. The antifoam agent could be an agent which solely acts to inhibit foam or it could be a surfactant which helps clean the boards and emulsify soils.

Preferred examples of antifoam agents include compounds formed by condensing ethylene oxide with a hydrophobic base formed by the condensation of propylene oxide with propylene glycol. The hydrophobic portion of the molecule which exhibits water insolubility has a molecular weight of from about 1,500 to 1,800. The addition of polyoxyethylene radicals to this hydrophobic portion tends to increase the water solubility of the molecule as a whole and the liquid character of the product is retained up to the point where polyoxyethylene content is about 50 percent of the total weight of the condensation product. Examples of such compositions are the "Pluronics" sold by BASF - Wyandotte. These compounds also enhance flux removal.

Other suitable antifoam agents that also enhance flux removal include: the polyethylene oxide/polypropylene oxide condensates of alkyl phenols, e.g., the condensation products of alkyl phenols having an alkyl group containing from about 6 to 12 carbon atoms in either a straight chain or branched chain configuration, with ethylene oxide/propylene oxide, the ethylene oxide being present in amounts equal to 1 to 25 moles of ethylene oxide per mole of alkyl phenol and the propylene oxide being present in amounts equal to 1 to 25 moles of propylene oxide per mole of alkyl phenol. The alkyl substituent in such compounds may be derived from polymerized propylene, diisobutylene, octene, or nonene, for example.

Also suitable are those derived from the condensation of ethylene oxide with the product resulting from the reaction of propylene oxide and ethylene-diamine or from the product of the reaction of a fatty acid with sugar, starch or cellulose. For example, compounds containing from about 40 percent to about 80 percent polyoxyethylene by weight and having a molecular weight of from about 5,000 to about 11,000 resulting from the reaction of ethylene oxide groups with a hydrophobic base constituted of the reaction product of ethylene diamine and excess propylene oxide, and hydrophobic bases having a molecular weight of the order of 2,500 to 3,000 are satisfactory.

In addition, the condensation product of aliphatic alcohols having from 8 to 18 carbon atoms, in either straight chain or branched chain configuration, with ethylene oxide and propylene oxide, e.g., a coconut alcohol-ethylene oxide-propylene oxide condensate having from 1 to 30 moles of ethylene oxide per mole of coconut alcohol, and 1 to 30 moles of propylene oxide per mole of coconut alcohol, the coconut alcohol fraction having from 10 to 14 carbon atoms, may also be employed.

The antifoam agents of the present invention are preferably employed in the flux removing compositions at about 0.01 to about 10 wt. % and in the flux removing solution in amounts of up to about 0.1 percent by weight, preferably, about 0.01 to 0.05 percent by weight based on the total weight of the aqueous flux removing solution. Thus, the antifoam agents can be included in the flux removing compositions, the aqueous concentrates or added directly to the aqueous wash bath as long as the addition results in the desired concentrations during use.

The present invention also contemplates the use of one more surfactants in the flux removing solutions in order to enhance the wetting and emulsifying ability of the flux remover and permit maximum penetration thereof within regions of the circuit boards most difficult to clean. The surfactant used could be the same agent used to control the foam. Suitable surfactants include anionic, nonionic, cationic surfactants or amphoteric surfactants or combinations thereof. The surfactants should be soluble, stable and, preferably, nonfoaming in use. A combination of surfactants may be employed. The term "surfactant", as used herein, may include other forms of dispersing agents or aids.

It has been found especially effective to use alkoxylated alcohols which are sold under the tradename of "Polytergent SL-Series" surfactants by Olin Corporation. Also, the polycarboxylated ethylene oxide condensates of fatty alcohols manufactured by Olin under the tradename of "Polytergent CS-1" have also been found effective, especially in combination with the above Polytergent SL-Series surfactants. An effective surfactant which also provides antifoam properties is "Polytergent SLF-18" also manufactured by Olin. A combination of this surfactant together with the above two surfactants has been found to provide excellent cleaning with low foam.

Examples of other suitable surfactants are the block copolymers of ethylene oxide and propylene oxide such as those supplied by the BASF Corporation as Pluronics.

Ethoxylated alcohols with 8 to 20 carbons, such as those containing from 3 to 30 moles of ethylene oxide per mole of alcohol could be used as surfactants in this invention. The monocarboxylated derivatives of these surfactants could also be used.

Sodium or potassium salts of sulfonated benzene or naphthalene derivatives such as alkyl benzene sulfonate, or alkyl naphthalene sulfonate or disulfonate could be used. However, caution would have to be employed since these surfactants might tend to impart excessive uncontrollable foam to the wash water.

The amount of surfactant utilized typically is no more than 15 wt. % of the composition but will vary depending on the conditions and the contamination encountered, and higher surfactant levels may be employed if so desired. Preferably, the surfactant comprises from about 0.5 to 8 wt. %.

The flux removing compositions of the present invention which are comprised of alkaline salts, silicate corrosion inhibitors, antifoam agents, surfactants and other optional adjuvants as set forth above are generally prepared as aqueous concentrates. Such aqueous flux removing concentrates may contain from about 5 up to about 45, or more, percent by weight of the components which form the cleaning compositions depending on the solubility thereof in water. Preferably, the concentrates contain about 10 to 20 percent, for example, about 15 percent by weight of the flux removing composition.

It may be necessary to include a hydrotrope in the aqueous concentrate to help solubilize any organic adjuvants such as surfactants, anti-foam agents, etc. which are contained in the salt-containing compositions. Optimally, the hydrotrope will be present in the composition in amounts of from about 0.2–15 wt. %. Preferred hydrotropes comprise the alkali metal salts of intermediate chain length monocarboxylic fatty acids, i.e., $C_7$–$C_{13}$. Other adjuvants could also be added to improve the properties or performance of the flux removing compositions. The balance of the concentrate is water. The dilutions of these concentrates are determined by manufacturing, packaging, shipping, storage, and other factors. It should be understood that the amount of solute in these concentrates is not especially critical.

It has been found that optimally the concentrates should be prepared hot for example at between 50° to 90° C. The polymer is first dissolved in water. This can sometimes be facilitated using a homogenizer. The silicate is then added as a concentrated solution. The alkaline salts are then added, followed by the surfactants and other ingredients.

The flux removing solutions which are employed in the cleaning procedures described herein usually contain from about 0.1 to 15, or more, percent, preferably, from about 0.6 to 15 percent and, more preferably, from about 1 to 3 percent by weight of the flux removing compositions of this invention with the balance being essentially water. The upper limit of concentration of the flux removing composition is not critical and is determined by fabrication conditions, the amount of residues and the difficulty of removing same from the circuit assemblies, etc.

The compositions of this invention are characterized by low environmental impact, unlike the chlorinated hydrocarbon solvents and other materials that had been used prior to this invention for printed circuit board cleaning. For example, the alkali metal carbonate and bicarbonate salts are naturally occurring and environmentally benign. The flux removing compositions of the invention have biological oxygen demand (BOD) and chemical oxygen demand (COD) values (as determined by methods hereinafter described more fully) which are much lower than alternative compositions currently available. As described in the Examples herein, the flux removing compositions result in very low BODs and CODs in the rinse water allowing the rinse water to be sewered without further treatment. In comparison, terpenes, e.g., limonene result in rinse water having BODs and CODs which may require removal before sewering.

The applicability of the compositions of the invention to various aspects of the printed circuit/wiring board fabrication process can best be understood by a description of a representative assembly process.

The assembly manufacturing process involves the placement of components such as integrated circuits, resistors, capacitors, diodes, etc. on the surface of the board or their insertion through pre-drilled holes. The components are then secured by soldering by mechanical or automatic means. Interspersed with the soldering operations are cleaning procedures and inspections to ensure that tape and solder flux residues than could lead to premature circuit failure do not remain.

For the removal of rosin soldering flux deposits and other residues during printed circuit/wiring board fabrication, the compositions of the invention may be applied to the boards by immersion in dip tanks or by hand or mechanical brushing. Alternatively, they may be applied by any of the commercially available printed wiring board cleaning equipment. Dishwasher size units may be employed, or much larger cleaning systems such as the "Poly-Clean +" and the various "Hydro-Station" models produced by Hollis Automation, Inc. of Nashua, N.H.

Depending upon their design, these washers may apply the flux removing compositions of the invention by spraying with mechanical nozzles or by rolling contact with wetted roller surfaces. The temperature at which the compositions may be applied can range from room, or ambient, temperature (about 70° F.) to about 180° F., preferably, about 140° to 170° F. The flux removing compositions or concentrates are diluted with water to from as low as about 0.1 percent by weight (or volume) concentration and up to about 15 percent by weight.

Once solder flux has been loosened and removed during a period of contact which typically ranges from about 1 to about 5 minutes, but may be longer up to about 10 minutes, the boards are taken from the flux removing solution. Another advantage of the instant invention is that the flux removing solutions need not be flushed with solvents as with the processes of the prior art. Herein, the boards may simply be flushed with water for a period of up to about 2 minutes. Deionized water is preferred. The optimal rinsing time varies according to the kinds of surfactants and the concentrations of the flux removing solutions used and can easily be determined by routine experimentation.

The cleaned boards are then dried, preferably with forced air. Drying is expedited if the air is warmed, preferably to above about 100° F.

The efficacy of rosin soldering flux removal from printed wiring boards is such that the boards meet stringent military specifications for low resistivity after cleaning. For example, the boards meet the Mil-P-28809A standard for low resistivity of the solvent extracts resulting when the contamination has been removed from a circuit board cleaned according to Mil-P-55110C. The resistivity of such solvent extracts after the cleaning of the boards is complete is most easily determined with an Omega Meter. Omega Meter is the registered trademark of Kenco Industries, Inc., Atlanta, Ga., for a microprocessor-controlled contamination test system that rapidly measures changes in resistivity due to contaminating ions.

The results of Omega Meter measurements are expressed in equivalent units of ug $NaCl/in^2$ or its metric equivalent. According to MIL-P-28809A, the acceptable resistivity value for a cleaned board is equivalent to 2.2. ug $NaCl/cm^2$ or 14 ug $NaCl/in^2$, but far better results are routinely obtained after solder flux has been removed with the flux removing solutions of the present invention. A value of about 0.31 ug $NaCl/cm^2$, or 2.0 ug $NaCl/in^2$, or even less, is typical.

The flux removing solutions of this invention are also effective in removing other undesirable and deleterious substances and residues. One particularly troublesome substance is the residue left by adhesive tape used during fabrication of the electronic circuit assemblies.

During the process of gold plating connecting tabs to improve corrosion resistance, tin-lead residues must first be removed from the unplated tabs. Removal of these residues is carried out through the use of etching chemicals that can damage other unprotected printed circuit/wiring board components. To protect vulnerable components from the etching chemicals, boards are wrapped on both sides with an adhesive plating tape which forms a shield or splash guard for all but the exposed tab area. The etching chemicals then remove the tin-lead residues on the tabs, a nickel plate is applied as a base for the gold, and gold plating of the tabs is finally carried out. The adhesive plating tape which is maintained in place through all of these etching and plating steps, is then removed. When the tape is removed following the nickel and gold plate step, it is at this point that the cleaning compositions of the invention may most advantageously be used.

Thus, following removal of the tape, a silicone-based and/or rubber-based adhesive residue may remain on the board. This residue may easily be removed by employing the compositions of the invention under the same conditions described above for solder flux removal. The exact operational parameters will be determined by the nature of the adhesive residue and the tenacity with which it adheres to the board, but the conditions described above are generally effective. As in the case of solder flux removal, treatment of the board with the flux removing solutions of the invention is generally followed by water flushing and air drying.

The efficiency of removal of adhesive residues from printed circuit/wiring boards by the compositions of the invention is such that no residues are visible after cleaning. A simple 5-10X stereomicroscope can facilitate visual inspection for tape residues following cleaning.

The following non-limiting Examples are provided to further illustrate the present invention. All percentages, unless otherwise noted, are by weight. However, due to the near equivalence of the weight and volume of the materials utilized, volume percent is essentially the same.

Examples I-IV

To illustrate the cleaning ability of the flux removing compositions of the invention, a series of demonstration printed wiring boards were cleaned in a mechanical cleaning system.

The cleaning composition contained, by weight, 75 percent potassium carbonate, 12.5 percent sodium bicarbonate, and 12.5 percent sodium carbonate monohydrate. Cleaning solutions having various concentrations were prepared.

The cleaning system was a "Poly-Clean +" machine which is manufactured by Hollis Automation, Inc. of Nashua, N.H.

The cleaning sequence comprised the operations of loading, washing, drying, first rinsing, final rinsing and high speed drying carried out in succession. The washing operation utilizing cleaning solutions of the invention was done in two stages, i.e., a first regular wash at spray nozzle manifold which directed a regular wash spray at 40 psig followed by a "hurricane" spray at 80 psig. The cleaning solutions were maintained at 160° F. The rinses were also two stage operations; the first at 40 psig regular rinse followed by an 80 psig "hurricane" rinse with the rinse water having a temperature of 160° F. A final rinse was effected under substantially the same conditions. The circuit boards were subjected to Alpha air knife drying after the washing and final rinse stages. In air knife drying, turbine propelled air shears fluids from the boards' surfaces.

Cleaned and dried boards were evaluated for cleaning efficiency both visually and by an Alpha 600 5MD Omega Meter resistivity measurements.

The visual test method uses a dyed flux and carrier base injected between glass components and a glass board. This provides excellent access for visual inspection. The analysis is further quantified by placing the board and components against a grid. Each block of the grid is then read as being completely clean or containing residue.

The test method utilizes straight flux and carrier from a rosin mildly activated (RMA) flux or paste. It is essentially the solder paste minus the solder. "Carrier" refers to both the flux paste and all other additives included in solder paste, except the solder. This carrier is then injected with red dye so that visual examination can be made more rapidly. The dye does not affect the carrier density or melting properties. The dyed carrier is then injected under the glass components on specially made test boards. RMA solder paste is not considered an aqueous-compatible flux. The test boards are constructed of glass. A $1'' \times 1''$ square coupon that simulates the component is mounted onto a glass substrate. The coupon is glued in place by first laying shim stock of the desired standoff height on the glass. Next, the glue is applied and the coupon set in place until it dries. When dry, the shim stock is removed. Six coupons are mounted on a single board at ¼" spacing. The interior coupons are further shielded from any nozzles by the first coupons in the placement array.

The flux carrier stock is injected under each coupon to entirely fill the inch-square area. Flux is also added to the area surrounding each coupon. The board is IR-reflowed at a typical dwell time of five minutes at reflow temperature. All boards are then stored for 24 hours at ambient temperature prior to cleaning. Reflowing and storing increases cleaning difficulty by allowing the board to cool and the flux carrier to set up.

Prior to reflow, the entire area under the coupon is filled with the dyed flux carrier. During reflow, a small percentage of the area under the coupon develops voids due to expansion and escape of flux volatiles. The area under the coupons filled with baked-on residue is measured prior to cleaning. The application method causes most of the flux to be bridged across the component standoff height. These regions entirely filled with flux are the most difficult to clean. They are also much less likely to occur in actual manufacturing processes since much less flux is applied. For the purposes of this test, however, no special measurement qualification is given to this category. By regarding all areas with flux trapped under them as the same, the test method is made more rigorous. This method is directed toward the measurement of cleaning effectiveness, which is defined as the percentage of residue removed. This aqueous cleaning test method is described more fully in a publication by Janet R. Sterritt, "Aqueous Cleaning Power," *Printed Circuit Assembly*, September 1989, pp. 26-29.

The results from the cleaning experiments are measured in terms of cleaning effectiveness as follows. The area of reflowed flux carrier is measured prior to cleaning. The test board is then cleaned and the amount of flux residue is visually measured with the aid of a grid pattern. The cleaning effectiveness rating is established by dividing the area still containing flux after cleaning by the total area containing flux prior to cleaning. The measurement technique shows that a completely clean board would result in a cleaning effectiveness rating of 100%. A test board on which three quarters of the initial residue is removed would show a 75% reading.

To make the resistivity measurements, cleaned and dried boards were loaded into a test cell of the instrument and then extracted with a circulating solution of isopropanol: water (25:75), v/v as specified by MIL-P-55110C and MIL-P-28809A. The resistivity of the solution was measured at a rate of 24 times per minute over a period of about 5-15 minutes until equilibrium was reached, indicating that extraction of board surface contamination was essentially complete. Equilibrium was defined as the point at which the change in measured resistivity of the solution was less than or equal to 5% of any value measured in the previous two minutes.

EXAMPLE I

In this example, demonstration glass printed wiring boards (as developed by Hollis Automation to evaluate cleaning solution and as hereinbefore described more fully) which were reflowed with Alpha flux paste as disclosed above were subjected to the sequence of cleaning operations also disclosed above. Five different concentrations of cleaning solutions, i.e., concentrations of 1.0, 1.7, 2.6, 3.5 and 6.0 percent were employed. Three different standoff distances were employed, viz., 2 mils, 6 mils, and 10 mils, respectively.

The results are shown in FIG. 1 in terms of cleaning effectiveness. These results clearly demonstrate the efficacy of the cleaning solutions of the present invention, especially at concentrations of 2.0 percent and above. The efficacy of the cleaning solutions at standoffs as low as 2 mils is especially noteworthy because of the difficulty in accessing the flux.

EXAMPLE II

Demonstration (H-40) circuit boards (circuit boards produced by Hollis Automation and which ware provided with drilled holes for the passage of leads therethrough) were immersed in flux and wave soldered with Kester 185 and evaluated both visually and on the Alpha 600 5MD Omega Meter for ionic contamination. FIGS. 2 and 3 illustrate the results of such evaluations. The visual evaluation in FIG. 2 again illustrates the effectiveness of the cleaning solutions of this invention. FIG. 3 confirms the visual results by extremely low ionic contamination results. FIG. 3 shows a concentration of about 2 percent results in an acceptable resistivity value of about 14 ug NaCl/in$^2$ according to MIL-P-28809A. The equilibrium resistivity measurements for the cleaning tests of Example II are also shown in Table I.

TABLE I

| RESISTIVITY MEASUREMENTS OF CLEANED ROSIN FLUX SOLDERED PRINTED WIRING BOARDS | | |
|---|---|---|
| Test Number | Cleaner Concentration (weight %) | Equivalent NaCl Contamination (ug/in$^2$) |
| 1 | 1.0 | 29.6 |
| 2 | 1.7 | 16.0 |
| 3 | 2.6 | 12.0 |
| 4 | 3.5 | 4.0 |
| 5 | 6.0 | 1.6 |

As shown in Table 1, the flux removing solutions examined were effective at concentrations below 2.0 percent in producing levels of residual board surface contamination that were far below the MIL-P-28809A requirement of 14 ug NaCl/in$^2$ equivalent. This is especially noteworthy in view of the configuration of the boards subjected to testing.

EXAMPLE III

Demonstration (H-50) circuit boards (produced by Hollis Automation and having fewer joints, etc. as the H-40 boards) were wave soldered with Kester 185.

Both FIGS. 4 and 5 support the surprising effectiveness of the cleaning solutions of the present invention by both visual testing (FIG. 4) and by Omega Meter testing for ionic contamination (FIG. 5).

Table II also shows the equilibrium resistivity measurements for the cleaning tests of Example III.

TABLE II

| RESISTIVITY MEASUREMENTS OF CLEANED ROSIN FLUX SOLDERED PRINTED WIRING BOARDS | | |
|---|---|---|
| Test Number | Cleaner Concentration (weight %) | Equivalent NaCl Contamination (ug/in$^2$) |
| 1 | 1.7 | 5.0 |
| 2 | 2.6 | 3.6 |
| 3 | 3.5 | 2.4 |

TABLE II-continued
RESISTIVITY MEASUREMENTS OF CLEANED ROSIN FLUX SOLDERED PRINTED WIRING BOARDS

| Test Number | Cleaner Concentration (weight %) | Equivalent NaCl Contamination (ug/in$^2$) |
|---|---|---|
| 4 | 6.0 | 0.8 |

As shown in Table II, the concentrations examined were all effective in producing levels of residual board surface contamination that were far below the MIL-P-28809A requirement of 14 ug NaCl/in$^2$ equivalent.

EXAMPLE IV

In this example, demonstration circuit boards similar to those of Example III were evaluated again both visually and for ionic contamination on the Omega Meter. These demo boards were reflowed with Kester R-229RMA paste. The results are shown in FIG. 6 which represents the results from visual testing and FIG. 7 which represents the ionic contamination results.

The equilibrium resistivity measurements for the cleaning tests effected in Example IV are also shown in Table III.

TABLE III
RESISTIVITY MEASUREMENTS OF CLEANED ROSIN FLUX SOLDERED PRINTED WIRING BOARDS

| Test Number | Cleaner Concentration (weight %) | Equivalent NaCl Contamination (ug/in$^2$) |
|---|---|---|
| 1 | 1.7 | 3.0 |
| 2 | 2.6 | 0 |
| 3 | 3.5 | 0 |
| 4 | 6.0 | 0 |

As shown in Table III, again, all the concentrations examined were effective in producing levels of residual board surface contamination that were far below the MIL-P-28809A requirement of 14 ug NaCl/in$^2$.

EXAMPLE V

For this Example separate tests were performed for effluent chemistry and aluminum abrasion in order to exemplify the environmental efficacy of the cleaning compositions of this invention. The effluent tests measured pH, BOD and COD. The methods employed are described in the following: (a) for chemical oxygen demand analysis see "Method for the Chemical Analysis of Water & Wastes, USEPA 600/4 79 020, Method 410.1 and (b) for biological oxygen demand analysis see "Method for the Chemical Analysis of Water & Wastes, USEPA 600/4 79 020, Method 405.1.

Two samples were drawn from the wash tank utilized in the previous Examples I–IV. Sample No. 1 was at a concentration of 2.6 percent by weight and Sample No. 2 was at a concentration of 3.5 percent by weight. No additional dilution was made, e.g., by mixing with the rinse water utilized. Each Sample was also measured for its pH. The results of these tests and measurements are presented in Table IV.

TABLE IV

| | Sample Number | |
|---|---|---|
| | 1 | 2 |
| Concentration (wt %) | 2.6 | 3.5 |
| BOD (ppm) | 35 | 33 |
| COD (ppm) | 71 | 71 |
| pH | 10.51 | 10.56 |

The results from the aluminum abrasion test showed no discoloration on the heat sinks. The evidences no corrosion or other chemical attack of aluminum surfaces.

The foregoing data clearly indicate the surprisingly low environmental impact accruing from the use of the cleaning compositions of this invention. The above BOD and COD values are markedly and, advantageously, lower than those required by various federal and/or state environmental agencies. These desirably lower values are also valuable in that costly containment equipment and the accompanying processing steps are either substantially reduced or rendered unnecessary.

EXAMPLE VI

This Example describes the methods utilized to attain the biological oxygen demand (BOD) and chemical oxygen demand (COD) values of representative concentrated cleaning solutions of this invention for comparative purposes with those of the prior art.

Accordingly, samples of a 26 percent concentrated solution of this invention containing, by weight, 75 percent potassium carbonate, 12.5 percent sodium bicarbonate and 12.5 percent sodium carbonate monohydrate and the remainder, i.e., 74 percent, water were prepared and tested according to the USEPA tests 600/4 79 020, methods 410.1 and 405.1 utilized in Example V.

The tests resulted in a BOD of less than 12 and a COD of less than 50. These values were reported as such since they were at the lowest threshold values reproduced by the tests.

These values compare favorably with prior art saponifiers, see for example, Hayes et al, U.S. Pat. Nos. 4,640,719 and 4,740,247 wherein BODs of about 295 and CODs of about 1,425 are reported.

EXAMPLE VII

This Example reports the pH values obtained from various concentrated cleaning solutions of the present invention.

In each test procedure the dry ingredients were initially dry mixed and then 35 percent by weight thereof was added to 65 percent by weight of deionized water.

The pH of three different concentrated cleaning solutions were as follows:

| Cleaner | pH |
|---|---|
| 1. 75 wt % potassium carbonate<br>12.5 wt % sodium bicarbonate<br>12.5 wt % sodium carbonate monohydrate | 11.15 |
| 2. 70 wt % potassium carbonate<br>30 wt % sodium bicarbonate | 10.80 |
| 3. 95 wt % potassium carbonate<br>5 wt % sodium bicarbonate | 11.97 |

Each of these cleaning concentrates exhibits a pH which is advantageously compatible with the electronic circuit boards being cleaned as well as the cleaning equipment presently utilized. Such solutions also are not environmentally detrimental and are easily processable and/or recoverable.

EXAMPLE VIII

The procedures of each of Examples I-IV are repeated except that 500 ppm of sodium bisulfite is added to the cleaning solutions as a reducing agent. The demo boards are cleaned consistent with the procedures of the Examples and then are examined as before. Visual testing and Omega Meter testing results are each comparable to the results of the previous tests. Visual examination indicates that the soldered joints remain shiny and are not dulled due to oxidation.

EXAMPLE IX

The procedure of Examples I-IV and VIII are repeated except that 500 ppm of hydrazine hydrate is added to the cleaning solutions as a reducing agent. After cleaning, the demo boards are examined as before. Visual and Omega Meter testing results are comparable to those of the previous tests. Visual examination also indicates that the soldered joints remain shiny. A further benefit accrues in that the hydrazine hydrate completely dissociates into water and leaves no film or residue.

EXAMPLE X

The procedures of each of Examples I-IV and VIII and IX are repeated except that 0.05 percent by weight of Pluronic L101 is added to cleaning solutions as an antifoam agent. Pluronic L101 is a poly(oxyethylene) poly(oxypropylene) poly(oxyethylene) block copolymer having a molecular weight of about 3800 and is sold by BASF-Wyandotte. It is noted that any foam resulting from the contact with and agitation of the fluxes and other foam producing residues is reduced. Visual and Omega Meter testing results are comparable to those of the previous tests.

EXAMPLES XI and XII

In the following two examples, the cleaning solutions were evaluated for cleaning and brightening efficacy on actual circuit boards using a Hollis Hydro - station 332 machine. Throughput time was 1.5 minutes and the bath temperature was 165° C.

|  | Examples | |
|---|---|---|
|  | XI | XII |
|  | wt. % present in wash bath | |
| Potassium carbonate | 1.320 | 1.320 |
| Sodium carbonate monohydrate | 0.220 | 0.220 |
| Sodium bicarbonate | 0.220 | 0.220 |
| Sodium polyacrylate | 0.330 | 0.330 |
| Sodium carboxymethylcellulose | 0.150 | 0.150 |
| Potassium silicate (29% aqueous solution) | 0.036 | 0.109 |
| Monotrope 1250 | 0.340 | 0.340 |
| Pluronic 25R2 | 0.020 | 0.020 |
| Plurafac RA30 | 0.020 | 0.020 |

Monotrope 1250 is a tradename of Mona Industries and consists of a solution of sodium nonanoate.

Pluronic 25R2 is a tradename of BASF Wyandotte and consists of a block copolymer of ethylene oxide and propylene oxide.

Plurafac RA30 is a tradename of BASF Wyandotte and consists of an alkoxylated surfactant alcohol.

Results are shown in Table V.

TABLE V

| Visual Cleaning and Brightening Results | | | |
|---|---|---|---|
| Flux type | Board Type | XI | XII |
|  |  | Cleaning | |
| Alpha | H-40 Through hole | B | B— |
| Kester | H-40 Through hole | B— | B— |
| Alpha | Demo Surface mount | A | A |
| Kester | Demo Surface mount | A | A |

A = Completely Clean
E = Not Clean

|  |  | Brightening | |
|---|---|---|---|
| Alpha | H-40 Through hole | C | A |
| Kester | H-40 Through hole | C | A |

A = Very bright joints
D = Very dull joints

The results show that both products were effective in removing the commercial fluxes from circuit boards. However, it can be seen that increasing the silicate level dramatically increased the brightening of the joints.

EXAMPLES XIII, XIV and XV

In the following examples, cleaning compositions were prepared and evaluated for cleaning ability using a laboratory screening test. For the test, loops of copper wire are dipped into molten rosin flux solder pastes and care is taken to ensure that a thick film of flux remains on the "joint" so formed. The rosin fluxes used represent the more difficult to remove fluxes available.

The joints were washed for 5 minutes in a relatively gently stirred temperature controlled 10% aqueous solution of the formulation being evaluated. Removal of the flux was determined by visual examination. Results are shown in Table VI.

|  | Examples wt. % present in formulation | | |
|---|---|---|---|
|  | XIII | XIV | XV |
| Potassium carbonate | 12.60 | 13.20 | 13.20 |
| Sodium carbonate monohydrate | 5.30 | 5.50 | 5.30 |
| Potassium hydroxide (50% aqueous solution) | 0.00 | 0.00 | 1.20 |
| Sodium hydroxide (50% aqueous solution) | 0.90 | 0.90 | 0.00 |
| Polyacrylic acid (50% aqueous solution) | 5.00 | 5.00 | 5.00 |
| Sodium carboxymethylcellulose | 1.50 | 1.50 | 1.50 |
| Potassium silicate (29% aqueous solution) | 1.25 | 1.25 | 1.25 |
| Monotrope 1250 | 3.40 | 3.00 | 4.40 |
| Pluronic 25R2 | 0.19 | 0.00 | 0.00 |
| Plurafac RA30 | 0.22 | 0.00 | 0.00 |
| Polytergent CS-1 | 0.00 | 0.25 | 0.10 |
| Polytergent SL-62 | 0.00 | 0.20 | 0.35 |
| Polytergent SLF-18 | 0.00 | 0.05 | 0.05 |
| Water | 69.64 | 69.15 | 67.65 |
| Total | 100.00 | 100.00 | 100.00 |
| Approximate pH | 10.80 | 10.80 | 10.80 |

Polytergent is a tradename of Olin Corp.

CS-1 is a carboxylated, ethoxylated fatty alcohol mixture, SL-62 and SLF-18 are alcoxylated fatty alcohol mixtures.

TABLE VI

| Visual cleaning results | | |
|---|---|---|
|  | Cleaning | |
| Wash temperature | Rosin Flux A | Rosin Flux B |
| Example XIII  165° F. | 4 | 3 |
| Example XIV  145° F. | 4 | 5 |
| Example XV  165° F. | 5 | 5 |

TABLE VI-continued

| | Visual cleaning results | |
|---|---|---|
| | | Cleaning |
| | Wash temperature | Rosin Flux A | Rosin Flux B |
| Control A | 165° F. | 5 | 3 |
| Control B | 165° F. | 5 | 4 |

1 = Very little removal
3 = moderate removal
5 = complete removal

Controls A and B, had as is pHs of 13.5 and 13.0, respectively, and were commercially available aqueous flux saponifiers containing monoethanolamine and 2-butoxyethanol as active ingredients. Each was used at their recommended usage concentrations of 5% and 8% respectively.

The results show that all three example formulations were moderately to highly effective in removing the rosin fluxes. They were comparable in performance to the commercial products Controls A and B.

EXAMPLE XVI

The following samples were prepared and evaluated for their tendency to corrode various aluminum substrates.

| | wt. % present in formulation | | |
|---|---|---|---|
| | Examples | Controls | |
| | XVI | C | D |
| Potassium carbonate | 15.84 | 0.00 | 13.20 |
| Sodium carbonate anhydrous | 0.00 | 10.60 | 0.00 |
| Sodium carbonate monohydrate | 0.56 | 2.18 | 2.18 |
| Sodium bicarbonate | 0.00 | 2.18 | 2.18 |
| Sodium hydroxide (50%) | 1.23 | 0.00 | 0.00 |
| Polyacrylic acid (50% solution) | 6.00 | 0.00 | 0.00 |
| Sodium carboxymethylcellulose | 1.50 | 0.00 | 0.00 |
| Benzothiazolethiol | 0.00 | 1.00 | 0.00 |
| Potassium silicate (29%, $SiO_2:K_2O$ = 2.4) | 1.25 | 0.00 | 0.00 |
| Monotrope 1250 | 3.40 | 0.00 | 0.00 |
| Pluronic 25R2 | 0.21 | 0.21 | 0.00 |
| Plurafac RA30 | 0.23 | 0.23 | 0.00 |
| Water | 69.78 | 83.60 | 82.54 |
| Total | 100.00 | 100.00 | 100.00 |
| Approximate pH | 10.80 | 10.80 | 10.50 |

Corrosion Test

Squares of aluminum test coupons measuring approximately ⅜" square were accurately weighed. They were then immersed in 10% aqueous solutions of the above formulations at 165° F. for 15 minutes. The coupons were rinsed in distilled water, air dried and reweighed. Loss of weight in an indication of corrosion. The results are summarized below.

| | % Loss in weight | | |
|---|---|---|---|
| | Example | Controls | |
| Aluminum Type | XVI | C | D |
| Aluminum 1100 | −0.01 | −1.51 | −2.22 |
| Aluminum alloy 5052 | 0.02 | 0.67 | 0.93 |
| Anodized aluminum 6061 | 0.00 | −1.36 | −1.97 |

It can be seen that the Example XVI containing potassium silicate was effective in inhibiting corrosion of the aluminum coupons. In contrast, control D, containing no corrosion inhibitor and Control C, containing benzothiazole, were highly corrosive to the aluminum substrates.

EXAMPLES XVII, XVIII AND XIX

The following electronic circuit board cleaners are useful alternatives to the strictly carbonate and/or bicarbonate cleaners of the previous examples. The formulations set forth below are as effective for removing rosin flux and other residues as the wholly carbonate-based cleaners.

| | Examples | | |
|---|---|---|---|
| | XVII | XVIII | XIX |
| Potassium pyrophosphate | 12.00 | 0.00 | 4.00 |
| Potassium tripolyphosphate | 0.00 | 8.00 | 0.00 |
| Trisodium phosphate | 2.00 | 0.00 | 4.00 |
| Potassium carbonate | 0.00 | 0.00 | 8.00 |
| Sodium metasilicate | 5.00 | 8.00 | 2.00 |
| Sodium silicate (3.1:1 ratio $SiO_2:Na_2O$) | 2.00 | 4.00 | 0.00 |
| Potassium silicate (3.9:1 ratio $SiO_2:K_2O$) | 0.00 | 0.00 | 2.00 |
| Pluronic 17R4 | 0.00 | 0.20 | 0.20 |
| Plurafac A-38 | 0.00 | 0.40 | 0.00 |
| Nedol 25-7 | 0.00 | 0.00 | 0.20 |
| Polytergent CS-1 | 0.40 | 0.00 | 0.10 |
| Polytergent SLF-18 | 0.10 | 0.00 | 0.10 |
| Sodium Carboxymethylcellulose | 1.50 | 1.20 | 1.50 |
| Sodium Octanoate | 1.00 | 1.00 | 1.20 |
| Water | qs | qs | qs |

Nedol 25-7 is an alcohol having a carbon chain length of $C_{12-15}$ and ethoxylated with an average of 7 mols of ethylene oxide, Shell Chemical Co.

EXAMPLE XX

This example illustrates the improvement in brightening achieved by addition of a silicate corrosion inhibitor to the alkaline salts.

| | wt. % present in wash bath | |
|---|---|---|
| | Control E | Example XX |
| Potassium carbonate | 1.260 | 1.260 |
| Sodium carbonate monohydrate | 0.210 | 0.210 |
| Sodium bicarbonate | 0.210 | 0.210 |
| Potassium silicate (44.1% aqueous solution - D type) | 0.000 | 0.120 |
| Pluronic 25R2 | 0.020 | 0.020 |
| Plurafac RA30 | 0.020 | 0.020 |

D Type silicate is supplied by PQ Corp. and has an $SiO_2:K_2O$ ratio of 2:1.

| | Cleaning and Brightening on H-40 through hole boards | |
|---|---|---|
| | Cleaning | Brightening |
| Control E | B | C |
| Example XX | A | A |

A = Very clean  A = Very bright joints
E = Not clean  D = Very dull joints

CONTROL EXAMPLES F-I

To illustrate the problem of silicate precipitation, the following control solutions were prepared:

| | F | G | H | I |
|---|---|---|---|---|
| Potassium carbonate (wt. %) | 20.50 | 8.20 | 9.60 | 9.60 |
| Sodium carbonate | 3.42 | 1.40 | 1.40 | 1.40 |
| Sodium bicarbonate | 3.42 | 1.40 | 0.00 | 0.00 |
| Sodium silicate (D type)* | 1.40 | 1.40 | 1.40 | 1.40 |

-continued

|  | F | G | H | I |
|---|---|---|---|---|
| Sodium hydroxide | 0.00 | 0.00 | 0.00 | to pH >13 |
| Water | qs | qs | qs | qs |
| Solution pH | 10.72 | 10.61 | 11.82 | 13.8 |
| Observations | Heavy Flocc. | Light Flocc. | Light Flocc. | Clear |

The results show that with solution pHs below 13.0, the silicate undesirably tends to flocculate from solution.

EXAMPLE XXI-XV

The following aqueous concentrates were prepared.

|  | XXI | XXII | XXIII | XXIV | XXV |
|---|---|---|---|---|---|
| Potassium carbonate | 0.0 | 13.1 | 15.8 | 15.8 | 12.6 |
| Sodium carbonate monohydrate | 2.2 | 0.0 | 0.6 | 2.2 | 2.1 |
| Sodium carbonate anhydrous | 10.6 | 0.0 | 0.0 | 0.0 | 0.0 |
| Sodium bicarbonate | 0.0 | 0.0 | 1.2 | 0.6 | 0.0 |
| Sodium hydroxide (50%) | 0.0 | 0.0 | 1.2 | 0.6 | 0.0 |
| Potassium bicarbonate | 0.0 | 2.6 | 0.0 | 0.0 | 0.0 |
| Sodium silicate | 0.8 | 0.0 | 1.3 | 0.0 | 0.0 |
| Potassium silicate (Kasil 1) | 0.0 | 1.2 | 0.0 | 1.2 | 1.2 |
| Surfactants/hydrotropes | 3.8 | 3.8 | 3.8 | 3.8 | 3.8 |
| Sodium polyacrylate (MW = 2000) | 6.0 | 6.0 | 6.0 | 5.0 | 0.0 |
| CMC (D.S. = 0.7) | 1.0 | 1.0 | 1.5 | 1.5 | 1.5 |
| CMC (D.S. = 1.2) | 0.0 | 0.0 | 1.5 | 1.5 | 1.5 |
| Water | qs | qs | qs | qs | qs |
| pH | 9.6 | 9.8 | 10.7 | 11.0 | 10.8 |

The above solutions demonstrated the ability of either CMC alone or in combination with a low molecular weight polyacrylate to stabilize the silicate. All of the above examples gave very slightly to moderately hazy solutions without a significant tendency for the silicate to separate on standing.

EXAMPLE XXVI

Additional concentrates were prepared to illustrate the advantage of adding the silicate stabilizer of this invention.

|  | EXAMPLE XXVI | CONTROL J |
|---|---|---|
| Potassium carbonate | 12.6 | 12.6 |
| Sodium carbonate monohydrate | 2.1 | 2.1 |
| Sodium hydroxide (50%) | 0.1 | 0.1 |
| Potassium silicate (Kasil 1) | 3.5 | 3.5 |
| Surfactants/hydrotropes | 2.8 | 2.8 |
| CMC (D.S. = 1.2) | 1.5 | 0.0 |
| Water | 77.4 | 78.9 |
| pH | 11.5 | 11.5 |

Example XXVI containing CMC provided a clear to very slightly hazy solution. Control J produced a white flocculent precipitate which settled to the bottom of the solution on standing for less than 24 hours.

EXAMPLES XXVII AND XXVIII

To illustrate the effect of anionic polymers other than CMC, formulations were prepared containing xanthan and alginate gums. Also prepared were formulations containing nonionic polymers to act as controls.

|  | EXAMPLES | | CONTROLS | |
|---|---|---|---|---|
|  | XXVII | XXVIII | K | L |
| Potassium carbonate | 12.6 | 12.6 | 12.6 | 12.6 |
| Sodium carbonate monohydrate | 2.1 | 2.1 | 2.1 | 2.1 |
| Sodium bicarbonate | 0.8 | 0.8 | 0.8 | 0.8 |
| Potassium silicate (Kasil 1) | 1.2 | 1.2 | 1.2 | 1.2 |
| Surfactants/hydrotropes | 2.8 | 2.8 | 2.8 | 2.8 |
| Keltro KT (Xanthan gum) | 0.7 | 0.0 | 0.0 | 0.0 |
| Keltone LV (Alginate gum) | 0.0 | 1.5 | 0.0 | 0.0 |
| Polyvinylpyrrolidone | 0.0 | 0.0 | 1.5 | 0.0 |
| Hydroxyethyl cellulose | 0.0 | 0.0 | 0.0 | 1.5 |
| Water | 79.8 | 79.0 | 79.0 | 79.0 |
| pH | 10.8 | 10.8 | 10.8 | 10.8 |

Examples XXVII and XXVIII containing anionic gums provided hazy solutions with no visible separation of the silicate on standing. Controls K and L containing nonionic polymers, produced products with significant sediments of silicate.

EXAMPLES XXIX AND XXXI

The following examples illustrate useful cleaners other than the strictly carbonate/bicarbonate cleaners set forth previously.

|  | EXAMPLES | | |
|---|---|---|---|
|  | XXIX | XXX | XXXI |
| Potassium pyrophosphate | 10.0 | 0.0 | 0.0 |
| Sodium tripolyphosphate | 0.0 | 5.0 | 0.0 |
| Trisodium orthophosphate | 0.0 | 0.0 | 5.0 |
| Sodium bicarbonate | 0.0 | 0.0 | 0.5 |
| Sodium silicate (SiO2:Na2O = 2.4) | 1.5 | 3.0 | 2.5 |
| Surfactants/hydrotropes | 2.8 | 3.5 | 5.0 |
| Xanthan gum | 1.0 | 0.0 | 0.0 |
| Sodium polymethacrylate | 0.0 | 1.5 | 0.0 |
| Sodium polyglycollate | 0.0 | 0.0 | 0.0 |
| Water | qs | qs | qs |

The discussion presented above is primarily concerned with electronic circuit assembly cleaners. It is to be well understood that the present invention is also directed to any aqueous cleaner in which the cleaning composition or aqueous cleaning concentrate comprises a high concentration, typically at least about 60 wt. % and 6.0 wt. %, respectively, of alkaline cleaning salts and a silicate such as to boost detersive action or as in anti-corrosive agent. It is in these types of cleaning compositions when added to aqueous solutions in diluted form or in the form of aqueous concentrates, does the disadvantageous precipitation of the silicate result adversely affecting the cleaning efficiency of the composition. This is particularly so in lower alkaline cleaning solutions such as household cleaners and the like and in the concentrated form such as supplied to an end-user, as often is the case in industrial uses. Thus, useful products other than the circuit board cleaning compositions as described above include laundry detergents, automatic dishwashing liquids, metal cleaners, carpet shampoos, floor tile cleaners, etc.

Many modifications and variations of this invention may be made without departing from its spirit and scope, as will become apparent to those skilled in the art. The specific embodiments described herein are offered by way of example only, and the invention is limited only by the terms of the appended claims.

What is claimed is:

1. A method for removing soldering flux or other residues from a printed wiring board, comprising
   (a) contacting the board with an aqueous flux removing solution comprising from about 0.1 to 15 percent by weight of a flux removing composition comprising alkaline salts, an alkali metal silicate and an anionic polymer for maintaining said silicate in solution, said solution having a pH of from about 10 to 13;
   (b) allowing the contact to continue for sufficient time to emulsify and remove soldering flux or residues; and
   (c) removing the combined composition and soldering flux or other residues from the board.

2. The method of claim 1 wherein said solution has an adequate reserve of titratable alkalinity, at least equivalent to from about 0.2 to 4.5 percent caustic potash when titrated to the colorless phenolphthalein end point.

3. The method of claim 1 or 2 wherein said solution has a pH of less than 12.

4. The method of claim 1 wherein said anionic polymer contains carboxylate groups.

5. The method of claim 4 wherein said anionic polymer is selected from carboxymethyl cellulose, polyacrylates, polymethacrylates and mixtures thereof.

6. The method of claim 5 wherein said anionic polymer is carboxymethyl cellulose or a mixture of carboxymethyl cellulose and polyacrylic acid.

7. The method of claim 1 or 4 wherein the flux removing composition comprises from about 60 to 98 percent by weight of said alkaline salts, from 0.1 to 10.0 percent by weight of said alkali metal silicate, at least 0.5 wt. % of said anionic polymer, and the balance, if any, of other adjuvants.

8. The method of claim 1 or 4 wherein said alkaline salts are selected from the sodium or potassium carbonates, bicarbonates, ortho phosphates, complex phosphates, silicates, citrates or mixtures thereof.

9. The method of claim 4 wherein said alkali metal silicate is potassium silicate.

10. The method of claim 4 wherein said alkaline salts comprise alkali metal carbonates and mixtures of said alkali metal carbonates and alkali metal bicarbonates.

11. The method of claim 1 wherein said flux removing solution contains from about 0.6 to 15 percent by weight of said composition.

12. The method of claim 5 wherein said flux removing solution contains from about 1 to 3 percent by weight of said composition.

13. The method of claim 1 wherein the contact is carried out at a temperature of from about room temperature to about 180° F. and for a period of from about 1 to 10 minutes.

14. The method of claim 1 wherein said aqueous flux removing solution is formed by adding an aqueous concentrate of said flux removing composition to water, said aqueous concentrate comprising about 5 to about 45 wt. % of said flux removing composition.

15. The method of claim 14 wherein said aqueous concentrate contains from about 10 to 20 wt. % of said flux removing composition.

16. The method of claim 14 wherein said composition includes an organic adjuvant and a hydrotrope comprising an alkali metal salt of a monocarboxylic acid having a carbon chain length of between $C_7$-$C_{13}$ is added to said aqueous concentrate to stabilize the adjuvant in said concentrate from precipitating.

17. The method of claim 1 wherein said cleaning solution is contacted with said boards in the form of a spray.

18. The method of claim 1 wherein said cleaning solution is contacted with said boards in the form of a bath in which said boards are immersed.

* * * * *